(12) United States Patent
Yano

(10) Patent No.: US 9,332,662 B2
(45) Date of Patent: May 3, 2016

(54) VENTILATION MEMBER

(71) Applicant: Nitto Denko Corporation, Ibaraki-shi, Osaka (JP)

(72) Inventor: Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 128 days.

(21) Appl. No.: 14/261,062

(22) Filed: Apr. 24, 2014

(65) Prior Publication Data

US 2015/0313034 A1 Oct. 29, 2015

(51) Int. Cl.
*B01D 53/22* (2006.01)
*H05K 5/02* (2006.01)
*F21S 8/10* (2006.01)

(52) U.S. Cl.
CPC ............. *H05K 5/0213* (2013.01); *B01D 53/22* (2013.01); *F21S 48/335* (2013.01)

(58) Field of Classification Search
CPC ........ B01D 46/00; B01D 45/16; B01D 53/22; B60R 16/0239; F21S 48/335; F21V 31/03; H02K 5/10; H02K 2205/09; H02K 5/0213
USPC .......................... 55/385.4, 462, DIG. 19; 96/4; 123/41.86; 454/367
See application file for complete search history.

(56) References Cited

U.S. PATENT DOCUMENTS

| 4,401,093 A | 8/1983 | Gates et al. |
| 4,993,517 A | 2/1991 | Leipelt et al. |
| 5,129,371 A | 7/1992 | Rosalik, Jr. |
| 5,891,223 A * | 4/1999 | Shaw ..................... B01D 46/10 55/385.4 |
| 6,994,621 B2 | 2/2006 | Mashiko et al. |
| 7,678,169 B1 | 3/2010 | Gwin et al. |
| 8,246,726 B2 * | 8/2012 | Yano .................... B60R 16/0239 123/41.86 |
| 8,814,993 B2 * | 8/2014 | Yano .................... H05K 5/0213 55/385.4 |
| 2005/0091950 A1 * | 5/2005 | Weaver ................... B60T 11/26 55/385.4 |
| 2005/0227610 A1 | 10/2005 | Zukor et al. |
| 2005/0279061 A1 * | 12/2005 | Broughton ............. B01D 45/16 55/385.4 |
| 2006/0096258 A1 * | 5/2006 | Gouzou ............... B60K 15/035 55/385.4 |
| 2008/0141635 A1 * | 6/2008 | Clerget ............... B05B 11/0021 55/385.4 |

(Continued)

FOREIGN PATENT DOCUMENTS

| JP | 2004-022520 | 1/2004 |
| JP | 2004-047425 | 2/2004 |
| JP | 2007-087666 | 4/2007 |

(Continued)

*Primary Examiner* — Duane Smith
*Assistant Examiner* — Minh-Chau Pham
(74) *Attorney, Agent, or Firm* — Hamre, Schumann, Mueller & Larson, P.C.

(57) ABSTRACT

The ventilation member of the present invention includes: a support having a through hole serving as a part of an air passage between an interior space and an exterior space of a housing when the support is attached to an opening of the housing; an air-permeable membrane disposed on the support to cover one end of the through hole that opens into the exterior space; and a cover member covering the support over the air-permeable membrane so as to form, between the cover member and the support, a ventilation space serving as a part of the air passage. The support includes a first oil-repellent portion formed around the air-permeable membrane. The first oil-repellent portion is formed by oil-repellent treatment of a part of a first surface of the support. The present invention provides a ventilation member suitable for preventing adhesion of oil to the air-permeable membrane even if the oil enters the inside of the cover member.

8 Claims, 5 Drawing Sheets

(56) References Cited

U.S. PATENT DOCUMENTS

2009/0047890 A1    2/2009    Yano et al.
2009/0084078 A1*    4/2009    Furuyama ............. F21S 48/335
                                                                  55/385.4

FOREIGN PATENT DOCUMENTS

| | | |
|---|---|---|
| JP | 2007-087929 | 4/2007 |
| JP | 2007-141629 | 6/2007 |
| JP | 2004-266211 | 9/2009 |

* cited by examiner

VENTILATION MEMBER

BACKGROUND OF THE INVENTION

1. Field of the Invention

The present invention relates to ventilation members.

2. Description of Related Art

Conventionally, in automotive electrical/electronic components such as automotive lamps and ECUs (electronic control units), OA (office automation) equipment, household electrical appliances, medical equipment, etc., openings are formed in housings containing electronic components, control boards, etc. to reduce pressure fluctuations due to temperature changes in the housings or to ventilate the interior of the housings, and ventilation members are attached to the openings. These ventilation members not only ensure ventilation between the interior and exterior of the housings but also prevent foreign substances such as dust and water from entering the housings. JP 2004-047425 A discloses an example of such a ventilation member. FIG. 8 shows a ventilation member disclosed in JP 2004-047425 A.

A ventilation member 110 includes a support 104, an air-permeable membrane 102 disposed on the support 104, a cover member 106 covering the air-permeable membrane 102, and a sealing member 108 to be mounted in a gap between the support 104 and a housing 120. The ventilation member 110 is fixed to an opening 121 of the housing 120 via the sealing member 108. Leg portions 112 of the support 104 are engaged with the opening 121 to prevent detachment of the ventilation member 110 from the housing 120. A plurality of apertures 106A are formed in the side wall of the cover member 106. Air flows into and out of the housing 120 through the air-permeable membrane 102 and the apertures 106A of the cover member 106. Thus, ventilation between the interior and exterior of the housing 120 can be ensured.

SUMMARY OF THE INVENTION

For example, in the case where a ventilation member is used in an automotive electrical/electronic component, oil droplets sometimes spread and adhere to the automotive electrical/electronic component during an oil change. In a conventional ventilation member, the oil may enter the inside of the cover member through the apertures formed in the side wall of the cover member and adhere to the air-permeable membrane.

In view of these circumstances, it is an object of the present invention to provide a ventilation member suitable for preventing adhesion of oil to an air-permeable membrane even if oil enters the inside of a cover member.

The present invention provides a ventilation member attachable to an opening of a housing. This ventilation member includes: a support having a through hole serving as a part of an air passage between an interior space and an exterior space of the housing when the support is attached to the opening; an air-permeable membrane disposed on the support to cover one end of the through hole that opens into the exterior space; and a cover member covering the support over the air-permeable membrane so as to form, between the cover member and the support, a ventilation space serving as a part of the air passage. The support includes a first oil-repellent portion formed around the air-permeable membrane. The first oil-repellent portion is formed by oil-repellent treatment of a part of a first surface of the support.

According to the present invention, the first oil-repellent portion formed by oil-repellent treatment of a part of the first surface of the support and formed around the air-permeable membrane prevents adhesion of oil to the air-permeable membrane even if the oil enters the ventilation space between the cover member and the support.

DETAILED DESCRIPTION OF THE INVENTION

Hereinafter, embodiments of the present invention are described with reference to the accompanying drawings. The following description relates to the examples of the present invention, and the present invention is not limited to these examples.

Figure 1:
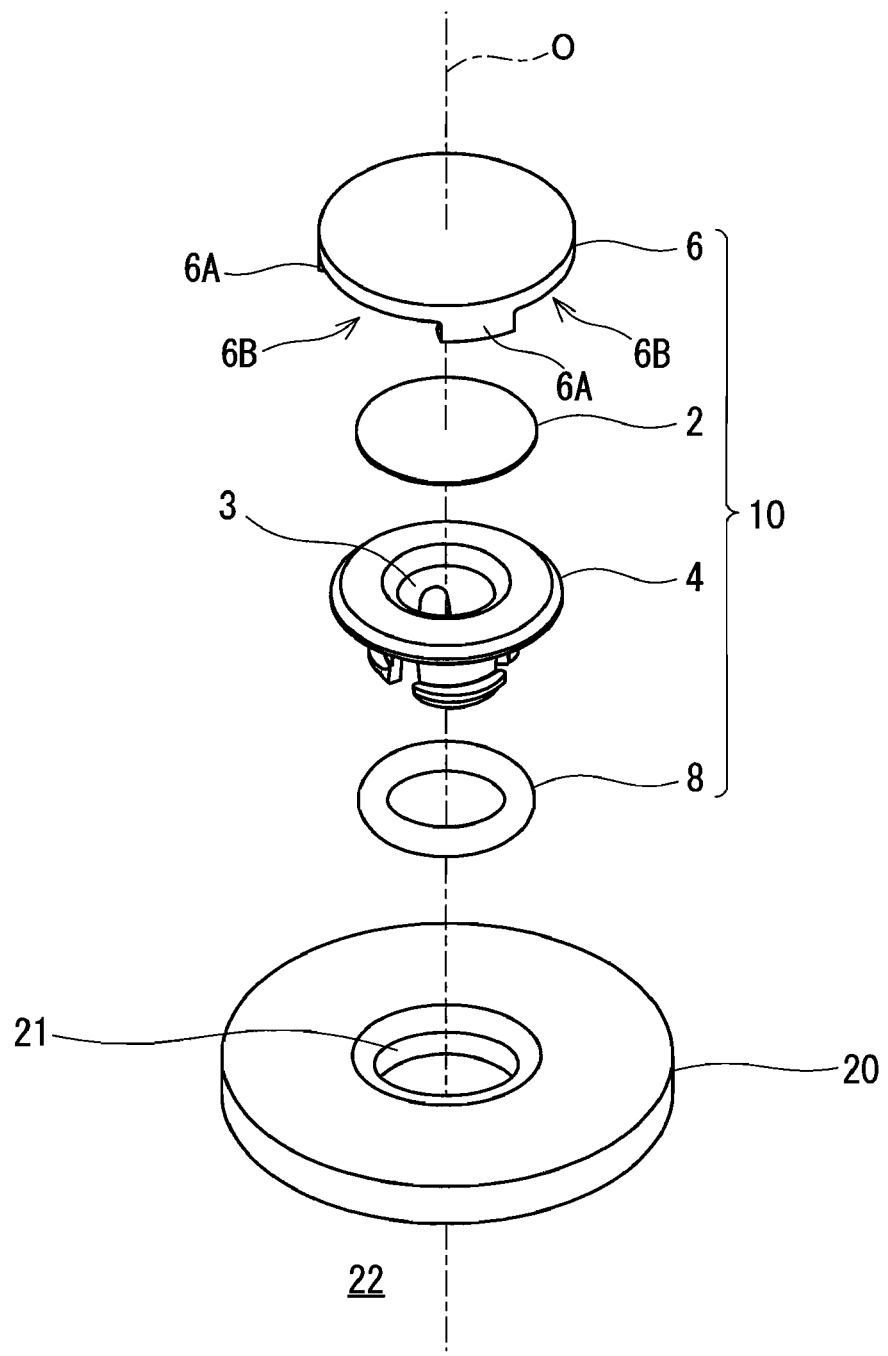
FIG. 1 is an exploded perspective view of a ventilation member according to an embodiment of the present invention.
Figure 2:
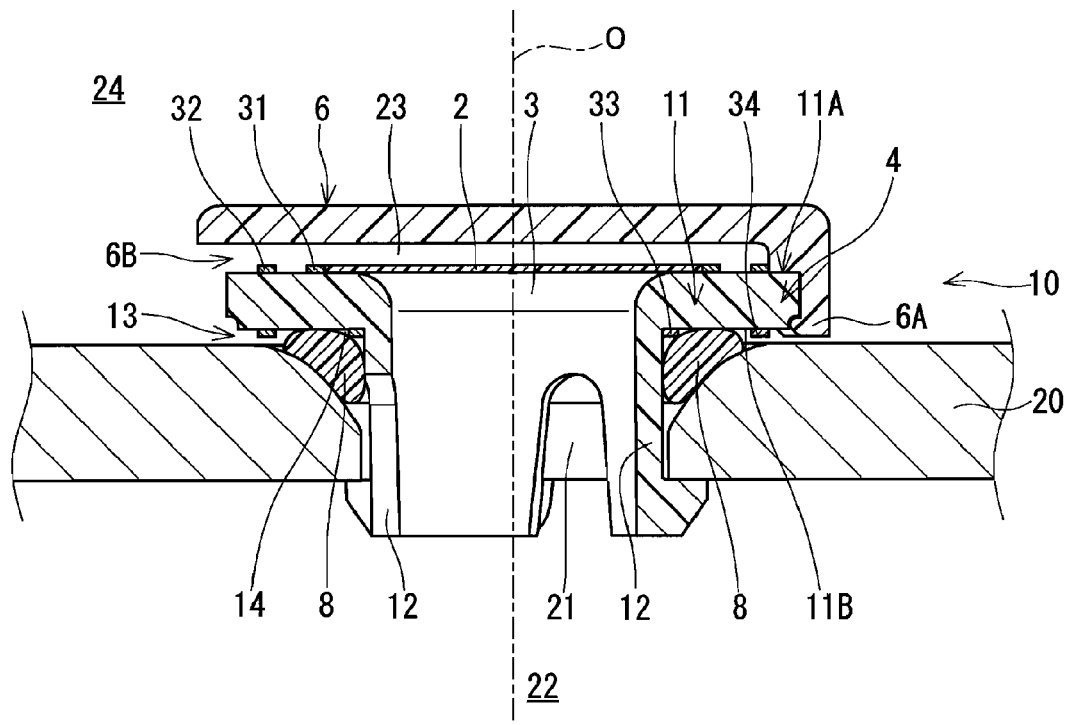
FIG. 2 is a cross-sectional view of the ventilation member shown in FIG. 1.

As shown in FIG. 1 and FIG. 2, a ventilation member 10 according to the present embodiment of the present invention is adapted to be attached to an opening 21 of a housing 20. As shown in FIG. 2, the opening 21 is a through hole communicating an interior space 22 and an exterior space 24 of the housing 20. The ventilation member 10 includes an air-permeable membrane 2, a support 4, a cover member 6, and a sealing member 8. The air-permeable membrane 2, the support 4, and the cover member 6 each have a circular outline in plan view. The air-permeable membrane 2, the support 4, and the cover member 6 have a common central axis O. The thickness direction of the air-permeable membrane 2 is parallel to the central axis O. The support 4 has a vent hole 3 serving as a part of an air passage between the interior space 22 and the exterior space 24. The air-permeable membrane 2 is disposed on the support 4 so as to cover one end of the vent hole 3 that opens into the exterior space 24. Air can flow between the interior space 22 and the exterior space 24 through the air-permeable membrane 2. The housing 20 is, for example, an automotive ECU (electronic control unit) box, and FIG. 1 and FIG. 2 show only a part of the housing 20.

As shown in FIG. 2, the support 4 has a base portion 11 and a plurality of leg portions 12. The base portion 11 supports the air permeable membrane 2. The leg portions 12 are adapted to fix the ventilation member 10 to the opening 21 of the housing 20. The leg portions 12 each extend from the base portion 11 toward the interior space 22 of the housing 20.

As shown in FIG. 1 and FIG. 2, the cover member 6 is attached to the support 4 so as to cover the air-permeable membrane 2. The cover member 6 has three locking portions 6A elastically engaged with the support 4 and three apertures 6B formed between the locking portions 6A. The locking portions 6A are provided at regular intervals (at regular angular intervals), and the apertures 6B are provided at regular intervals (at regular angular intervals). As shown in FIG. 2, a ventilation space 23 is formed between the cover member 6 and the air-permeable membrane 2 and between the outer periphery of the cover member 6 and the outer periphery of the support 4. The ventilation space 23 communicates with the exterior space 24 through the apertures 6B formed in the side wall of the cover member 6. The ventilation space 23 serves as a part of the air passage between the interior space 22 and the exterior space 24.

Figure 4:
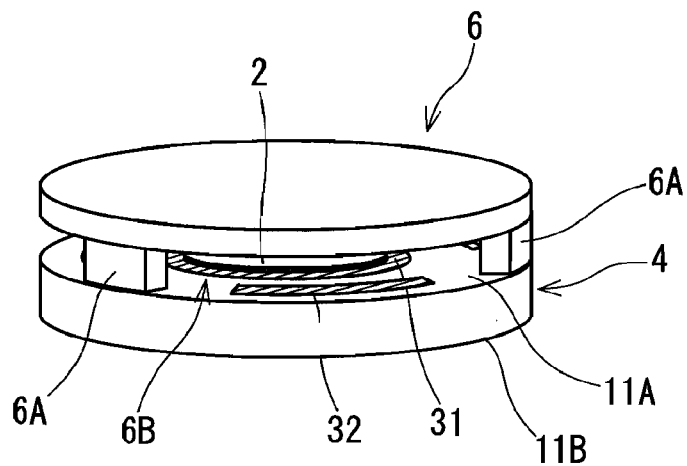
FIG. 4 is a perspective view of a cover member and a part of a support shown in FIG. 1.
Figure 5:
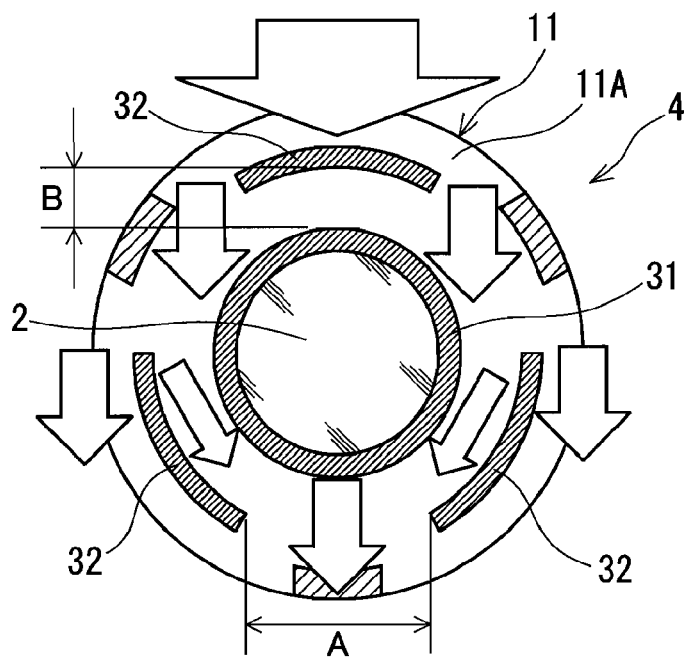
FIG. 5 is a top view of the support shown in FIG. 1.

As shown in FIG. 4 and FIG. 5, the support 4 has, on a first surface 11A of the base portion 11 on which the air-permeable membrane 2 is disposed, a first oil-repellent portion 31 and second oil-repellent portions 32 formed by oil-repellent treatment of a part of the first surface 11A. The first surface 11A of the base portion 11 other than the first oil-repellent portion 31 and the second oil-repellent portions 32 is not subjected to oil-repellent treatment.

As shown in FIG. 5, the first oil-repellent portion 31 formed by oil-repellent treatment of a part of the first surface 11A of the base portion 11 is formed around the air-permeable membrane 2. Specifically, the first oil-repellent portion 31 is a ring-shaped portion formed along the outer edge of the air-permeable membrane 2. As shown in FIG. 4, the second oil-repellent portions 32 formed by oil-repellent treatment of a part of the first surface 11A of the base portion 11 are formed so as to be exposed to the apertures 6B of the cover member 6. Specifically, as shown in FIG. 5, the second oil-repellent portions 32 are three arc-shaped portions formed around the first oil-repellent portion 31 such that the second oil-repellent portions 32 are spaced apart from each other. Spaces are formed between the adjacent second oil-repellent portions 32. A distance A between the adjacent second oil-repellent portions 32 is 2 mm or more and 6 mm or less, and preferably 2 mm or more and 3 mm or less. When the distance A between the adjacent second oil-repellent portions 32 is within the above range, oil is less likely to enter through the spaces between the adjacent second oil-repellent portions 32. A distance B between the first oil-repellent portion 31 and each of the second oil-repellent portions 32 is 2 mm or more and 6 mm or less, and preferably 3 mm or more and 6 mm or less. When the distance B between the first oil-repellent portion 31 and the second oil-repellent portions 32 is within the above range, oil entering a region between the first oil-repellent portion 31 and the second oil-repellent portions 32 flows smoothly. The spaces between the adjacent second oil-repellent portions 32 and the region between the first oil-repellent portion 31 and the second oil-repellent portions 32 are not subjected to oil-repellent treatment, as described above.

Figure 6:
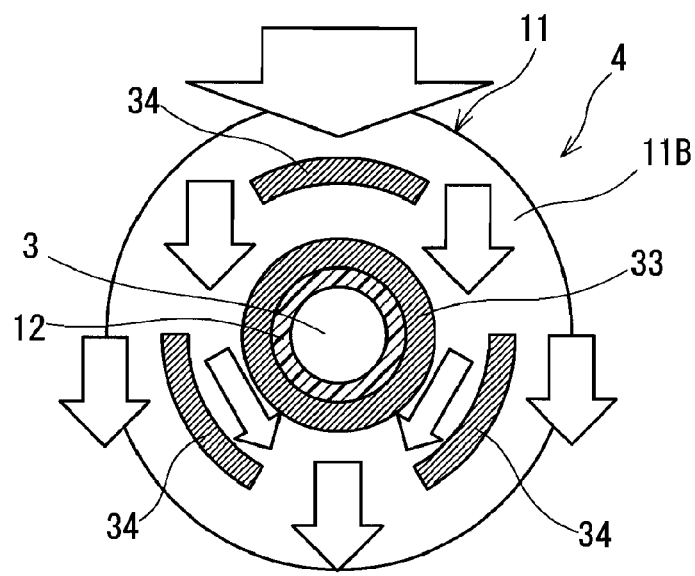
FIG. 6 is a bottom view of the support shown in FIG. 1.

As shown in FIG. 6, the support 4 further has, on a second surface 11B of the base portion 11 on the interior space 22 side (on which the air-permeable membrane 2 is not disposed), a third oil-repellent portion 33 formed in a ring shape around the leg portions 12 surrounding the vent hole 3 and fourth oil-repellent portions 34 formed around the third oil-repellent portion 33 such that the fourth oil-repellent portions 34 are spaced apart from each other. The third oil-repellent portion 31 is formed by oil-repellent treatment of a part of the second surface 11B. The fourth oil-repellent portions 34 are formed by oil-repellent treatment of a part of the second surface 11B. The second surface 11B of the base portion 11 other than the third oil-repellent portion 33 and the fourth oil-repellent portions 34 is not subjected to oil-repellent treatment.

As shown in FIG. 6, the fourth oil-repellent portions 34 are three arc-shaped portions formed around the third oil-repellent portion 33 such that the fourth oil-repellent portions 34 are spaced apart from each other. Spaces are formed between the adjacent fourth oil-repellent portions 34. A preferable range of a distance between the adjacent fourth oil-repellent portions 34 is the same as the preferable range of the distance A between the adjacent second oil-repellent portions 32. A preferable range of a distance between the third oil-repellent portion 33 and the fourth oil-repellent portions 34 is the same as the preferable range of the distance B between the first oil-repellent portion 31 and the second oil-repellent portions 32. The spaces between the adjacent fourth oil-repellent portions 34 and the region between the third oil-repellent portion 33 and the fourth oil-repellent portions 34 are not subjected to oil-repellent treatment, as described above.

In the present embodiment, the entire surface of the cover member 6 facing the first surface 11A of the support 4 is subjected to oil-repellent treatment. However, only portions of the cover member 6 facing the first oil-repellent portion 31 and the second oil-repellent portions 32 may be subjected to oil-repellent treatment. The shapes of the first oil-repellent portion 31, the second oil-repellent portions 32, the third oil-repellent portion 33, and the fourth oil-repellent portions 34 are not limited to those of the embodiment described above. For example, the first oil-repellent portion 31 may be formed in a rectangular shape around the air-permeable membrane 2. The first oil-repellent portion 31 may include a plurality of (for example, three) arc-shaped portions formed around the air-permeable membrane 2 such that the arc-shaped portions are spaced apart from each other.

The oil-repellent treatment to which the first oil-repellent portion 31, the second oil-repellent portions 32, the third oil-repellent portion 33, the fourth oil-repellent portions 34, and the cover member 6 are subjected can be performed by a known method. The oil-repellent agent used for the oil-repellent treatment is not particularly limited. Typically, it is a material containing a polymer having a perfluoroalkyl group. The oil-repellent treatment may be a treatment for forming an oil-repellent coating layer containing a polymer having a perfluoroalkyl group. Examples of the method for forming an oil-repellent coating layer include: coating methods using a solution or a dispersion containing a polymer having a perfluoroalkyl group, such as air spraying, electrostatic spraying, dip coating, spin coating, roll coating (including kiss coating and gravure coating), curtain flow coating, and impregnation; and layer forming methods such as electrodeposition coating and plasma polymerization. However, the coating method is not particularly limited as long as a desired coating layer can be formed. In order to form the first oil-repellent portion 31, the second oil-repellent portions 32, the third oil-repellent portion 33, and the fourth oil-repellent portions 34 in the shapes described above, the above-described oil-repellent treatment can be performed by masking the portions where the first to fourth oil-repellent portions 31 to 34 are not to be formed.

In the present embodiment, when oil enters the ventilation space 23 between the cover member 6 and the support 4 through an aperture 6B of the cover member 6, the oil flows in directions of arrows shown in FIG. 5. More specifically, when the oil enters the ventilation space 23 through the aperture 6B of the cover member 6, it passes through a space between adjacent second oil-repellent portions 32 and then flows in a region between the first oil-repellent portion 31 and the second oil-repellent portions 32. Then, after flowing in the region between the first oil-repellent portion 31 and the second oil-repellent portions 32, the oil passes through another space between adjacent second oil-repellent portions 32, and is discharged to the exterior space 24 through another aperture 6B of the cover member 6. In the present embodiment, the first oil-repellent portion 31 prevents adhesion of oil to the air-permeable membrane 2 even if the oil enters the ventilation space 23 between the cover member 6 and the support 4.

In the present embodiment, when oil enters a gap 14 (see FIG. 2) between the sealing member 8 and the support 4 through a gap 13 (see FIG. 2) between the support 4 and the housing 20, the oil flows in directions of arrows shown in FIG. 6. More specifically, when the oil enters the gap 13, it passes through a space between adjacent fourth oil-repellent portions 34 and then flows in a region between the third oil-repellent portion 33 and the fourth oil-repellent portions 34 in the gap 14. Then, after flowing in the region between the third oil-repellent portion 33 and the fourth oil-repellent portions 34 in the gap 14, the oil passes through another space between adjacent fourth oil-repellent portions 32, and is discharged to the exterior space 24 through the gap 13. In the present embodiment, the third oil-repellent portion 33 and the fourth oil-repellent portions 34 prevent entry of oil into the through hole 3 even if the oil enters the gap 14.

(Modification)

Figure 7:
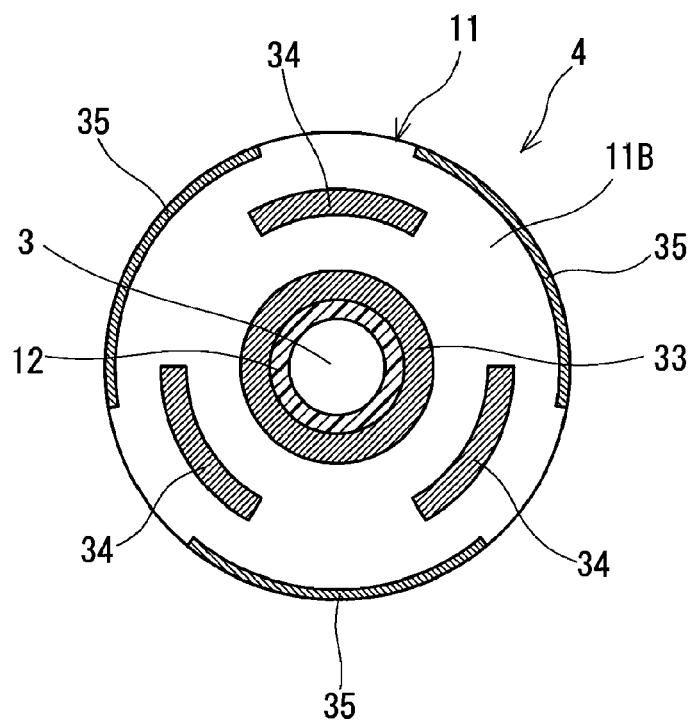
FIG. 7 is a bottom view of a support according to a modification of the present invention.
Figure 8:
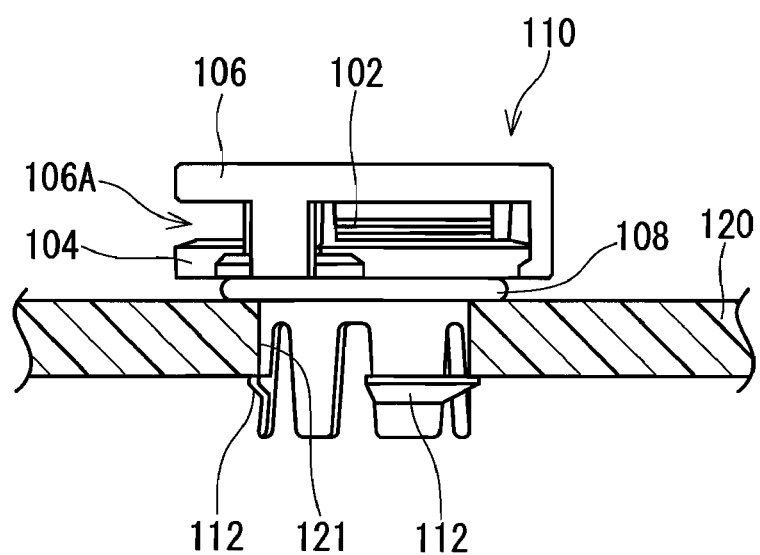
FIG. 8 is a cross-sectional view of a conventional ventilation member.

FIG. 7 shows a ventilation member according to a modification. The ventilation member according to the modification is the same as the embodiment described above except for the support 4. Therefore, the description of the same parts is omitted.

As shown in FIG. 7, the support 4 further has, on the second surface 11B of the base portion 11, fifth oil-repellent portions 35 formed around the fourth oil-repellent portions 34 such that the fifth oil-repellent portions 35 are spaced apart from each other. The fifth oil-repellent portions 35 are formed by oil-repellent treatment of a part of the second surface 11B. The fifth oil-repellent portions 35 are formed along the outer edge of the support 4. The fifth oil-repellent portions 35 are three arc-shaped portions formed around the fourth oil-repellent portions 34 such that the fifth oil-repellent portions 35 are spaced apart from each other. Spaces are formed between the adjacent fifth oil-repellent portions 35. The fifth oil-repellent portions 35 are formed to face the spaces between the adjacent fourth oil-repellent portions 34.

The support 4 may further have, on the first surface 11A of the base portion 11, oil-repellent portions formed around the second oil-repellent portions 32 such that the additional oil-repellent portions are spaced apart from each other, although not shown. These additional oil-repellent portions are formed by oil-repellent treatment of a part of the first surface 11A.

The sealing member 8 is an elastic member for sealing the gap between the support 4 and the housing 20 when the ventilation member 10 is attached to the housing 20. The sealing member 8 is made of, for example, an elastomer such as nitrile rubber, ethylene-propylene rubber, silicone rubber, fluorine rubber, acrylic rubber, or hydrogenated nitrile rubber. The sealing member 8 may be made of a foam material instead of an elastomer.

When the leg portions 12 of the support 4 are inserted into the opening 21 of the housing 20, the support 4 is pushed back in the direction in which it is removed from the housing 20 by the elastic force of the sealing member 8 interposed between the support 4 and the housing 20. When the support 4 is pushed back, the hooks of the leg portions 12 are engaged with the housing 20 in the interior space 22 of the housing 20 so as to prevent detachment of the ventilation member 10 from the housing 20. The portion corresponding to the sealing member 8 may be formed integrally with the support 4 by a technique such as two-color molding or insert molding. The sealing member 8 may be bonded to the support 4.

Figure 3:
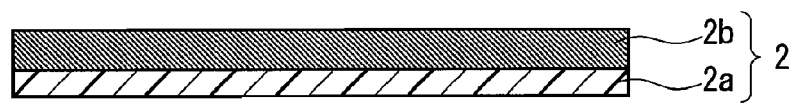
FIG. 3 is a cross-sectional view of an air-permeable membrane shown in FIG. 1.

Next, the air-permeable membrane 2 is described. The structure and material of the air-permeable membrane 2 are not particularly limited and any membrane can be used as long as it has the properties of allowing gases to pass therethrough and preventing liquids from passing therethrough. As shown in FIG. 3, the air-permeable membrane 2 may have a membrane body 2a and a reinforcing material 2b laminated on the membrane body 2a. The strength of the air-permeable membrane 2 is increased by the reinforcing material 2b added thereto. It should be understood that the air-permeable membrane 2 may consist of the membrane body 2a.

The membrane body 2a may be subjected to an oil-repellent treatment or a water-repellent treatment. Such liquid-repellent treatment can be performed by applying a substance having a low surface tension to the membrane body 2a, followed by drying and then curing. Any liquid-repellent agent can be used for the liquid-repellent treatment as long as a coating film having a lower surface tension than that of the membrane body 2a can be formed using the agent. For example, a liquid-repellent agent containing a polymer having a perfluoroalkyl group can be suitably used. The liquid-repellent agent is applied to the membrane body 2a by a known technique such as impregnation or spraying.

A typical example of the membrane body 2a is a porous membrane made of a fluorine resin or a polyolefin. In terms of ensuring sufficient waterproofness, a porous resin membrane having an average pore diameter of 0.01 to 10 μm can be used as the membrane body 2a.

Examples of the fluorine resin suitable for use as the membrane body 2a include polytetrafluoroethylene (PTFE), polychlorotrifluoroethylene, tetrafluoroethylene-hexafluoropropylene copolymer, and tetrafluoroethylene-ethylene copolymer. Examples of the polyolefin suitable for use as the membrane body 2a include polymers and copolymers of monomers such as ethylene, propylene, and 4-methylpentene-1,1 butene. Porous nanofiber film materials containing polyacrylonitrile, nylon, or polylactic acid may also be used. In particular, PTFE is preferred because it has not only high air permeability per unit area but also high ability to prevent foreign substances from entering the housing. Porous PTFE membranes can be produced by known molding techniques such as stretching and extraction.

The reinforcing material 2b can be a member made of a resin such as polyester, polyethylene, or aramid. The form of the reinforcing material 2b is not particularly limited as long as the air permeability of the air-permeable membrane 2 can be maintained. For example, the reinforcing member 2b is a woven fabric, a nonwoven fabric, a net, a mesh, a sponge, a foam, or a porous material. The membrane body 2a and the reinforcing member 2b may be laminated together by heat lamination, heat welding, or ultrasonic welding, or with an adhesive.

The thickness of the air-permeable membrane 2 is preferably in the range of 1 μm to 5 mm, in view of the strength and the ease of handling. The air permeability of the air-permeable membrane 2 is preferably in the range of 0.1 to 300 sec/100 $cm^3$ in terms of Gurley Number obtained by the Gurley test method specified in JIS (Japanese Industrial Standards) P 8117. The water entry pressure of the air-permeable membrane 2 is preferably 1.0 kPa or more.

Next, a method for producing the ventilation member 10 is described. First, the support 4 and the cover member 6 are produced separately. The support 4 and the cover member 6 each can be produced by a known injection molding technique. The material that can be used for the support 4 and the cover member 6 is typically a thermoplastic resin. Examples of the thermoplastic resin include polybutylene terephthalate, nylon, and polyethylene terephthalate.

The housing 20 also can be produced by a known injection molding technique. As shown in FIG. 1 and FIG. 2, one end of the opening 21 that opens into the exterior space 24 has a larger diameter than the other end of the opening 21 that opens into the interior space 22. Such leg portions 12 are suitable for being inserted into the opening 21. In addition, this shape of the opening 21 can increase, to some extent, the cross-sectional area of the air passage from the vent hole 3 to the interior space 22. Furthermore, since the diameter of the opening 21 is smaller on the interior space 22 side, the leg portions 12 are set to be inclined with respect to the central axis O. This is preferable in securely engaging the hooks of the leg portions 12 with the opening 21 to increase the attachment strength of the ventilation member 10 to the housing 20.

Hereinafter, the present invention will be described in more detail by way of examples, but the present invention is not limited to the following examples.

Example

Teflon (registered trademark) AF (manufactured by Du Pont-Mitsui Fluorochemicals Company, Ltd.) was dissolved in Florinate (registered trademark) (manufactured by Sumitomo 3M Inc.) to obtain a 3 wt. % solution. A support of a ventilation member Z-PLUG (manufactured by Nitto Denko Corporation) having a structure as shown in FIG. 1 and FIG. 2 was prepared, and the support was immersed in the solution, with portions of the surface of the support on which the first and second oil-repellent portions were not to be formed being masked. Thus, the first oil-repellent portion and the second oil-repellent portions were formed on the support. The first and second oil-repellent portions were arranged as shown in FIG. 5. The support was placed on its side such that the side wall of the base portion faced upward and then fixed. Then, about 2 ml of ATF (Automatic Transmission Fluid) Auto Fluid D-II (manufactured by Toyota Motor Corporation) was dropped from above the support. No ATF adhered to the air-permeable membrane.

Comparative Example

A non oil-repellent support of a ventilation member Z-PLUG was placed on its side such that the side wall of the base portion faced upward and then fixed. About 2 ml of ATF was dropped from above the support. ATF adhered to the air-permeable membrane.

These results confirmed that the ventilation member of Example having the first and second oil-repellent portions was effective in preventing adhesion of oil to the air-permeable membrane.

The ventilation member of the present invention is suitable for use in housings for automotive components such as lamps, motors, sensors, switches, ECUs, and gear boxes. The ventilation member of the present invention can be used not only for automotive components but also for electric appliances such as mobile communication devices, cameras, electric shavers, and electric toothbrushes.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A ventilation member attachable to an opening of a housing, the ventilation member comprising:
   a support having a through hole serving as a part of an air passage between an interior space and an exterior space of the housing when the support is attached to the opening;
   an air-permeable membrane disposed on the support so as to cover one end of the through hole that opens into the exterior space; and
   a cover member covering the support over the air-permeable membrane so as to form, between the cover member and the support, a ventilation space serving as a part of the air passage,
   wherein the support comprises:
      a first oil-repellent portion formed around the air-permeable membrane, the first oil-repellent portion being formed by an oil-repellent treatment of a part of a first surface of the support; and
      a second oil-repellent portion formed around an end of the through hole that opens into the interior space, opposite to the one end thereof opening to the exterior space, the second oil-repellent portion being formed by an oil-repellent treatment of a part of a second surface of the support.

2. The ventilation member according to claim 1, wherein the first oil-repellent portion is formed along an outer edge of the air-permeable membrane.

3. The ventilation member according to claim 1, wherein the first oil-repellent portion has a ring shape.

4. The ventilation member according to claim 1, wherein the support further comprises third oil-repellent portions formed around the first oil-repellent portion such that the third oil-repellent portions are spaced apart from each other, the third oil-repellent portions being formed by an oil-repellent treatment of a part of the first surface of the support.

5. The ventilation member according to claim 4, wherein
   the cover member has an aperture in a side wall of the cover member, the aperture communicating the ventilation space with the exterior space, and
   the third oil-repellent portions are formed so as to be exposed to the aperture of the cover member.

6. The ventilation member according to claim 4, wherein the third oil-repellent portions each have an arc shape.

7. The ventilation member according to claim 1, wherein the support further comprises fourth oil-repellent portions formed around the third oil-repellent portion such that the fourth oil-repellent portions are spaced apart from each other, the fourth oil-repellent portions being formed by an oil-repellent treatment of a part of the second surface of the support.

8. The ventilation member according to claim 1, wherein the ventilation member further comprises a sealing member disposed between the second surface of the support and the housing.

* * * * *